United States Patent
Oka et al.

(10) Patent No.: US 11,894,225 B2
(45) Date of Patent: Feb. 6, 2024

(54) INDIUM PHOSPHIDE SUBSTRATE, SEMICONDUCTOR EPITAXIAL WAFER, AND METHOD FOR PRODUCING INDIUM PHOSPHIDE SUBSTRATE

(71) Applicant: JX METALS CORPORATION, Tokyo (JP)

(72) Inventors: Shunsuke Oka, Kitaibaraki (JP); Hideki Kurita, Kitaibaraki (JP); Kenji Suzuki, Kitaibaraki (JP)

(73) Assignee: JX METALS CORPORATION, Tokyo (JP)

( * ) Notice: Subject to any disclaimer, the term of this patent is extended or adjusted under 35 U.S.C. 154(b) by 267 days.

(21) Appl. No.: 17/289,524

(22) PCT Filed: Jun. 4, 2020

(86) PCT No.: PCT/JP2020/022198
§ 371 (c)(1),
(2) Date: Apr. 28, 2021

(87) PCT Pub. No.: WO2021/106249
PCT Pub. Date: Jun. 3, 2021

(65) Prior Publication Data
US 2022/0310382 A1 Sep. 29, 2022

(30) Foreign Application Priority Data

Nov. 29, 2019 (JP) .................................. 2019-217552
Apr. 27, 2020 (JP) .................................. 2020-078636

(51) Int. Cl.
| | | |
|---|---|---|
| H01L 21/02 | (2006.01) | |
| B28D 5/04 | (2006.01) | |
| C30B 25/18 | (2006.01) | |
| C30B 29/40 | (2006.01) | |
| C30B 33/10 | (2006.01) | |
| H01L 29/20 | (2006.01) | |

(52) U.S. Cl.
CPC ........ *H01L 21/02019* (2013.01); *B28D 5/042* (2013.01); *C30B 25/186* (2013.01); *C30B 29/40* (2013.01); *C30B 33/10* (2013.01); *H01L 29/20* (2013.01)

(58) Field of Classification Search
CPC ............... C30B 29/40; H01L 21/02013; H01L 21/02019; H01L 21/02021; H01L 21/02024; H01L 21/304; H01L 2924/3511; H01L 21/02002
See application file for complete search history.

(56) References Cited

U.S. PATENT DOCUMENTS

| | | | |
|---|---|---|---|
| 4,844,047 A * | 7/1989 | Brehm | C30B 33/00 125/20 |
| 9,806,059 B1 * | 10/2017 | Lee | H01L 21/78 |
| 2015/0194319 A1 * | 7/2015 | Loboda | H01L 21/02008 438/692 |
| 2016/0351742 A1 * | 12/2016 | Akita | H01L 29/06 |
| 2018/0122749 A1 * | 5/2018 | Lee | H01L 21/486 |
| 2018/0358221 A1 * | 12/2018 | Carlson | H01L 29/2003 |
| 2019/0157834 A1 * | 5/2019 | Clark | H01L 21/02546 |
| 2019/0189421 A1 | 6/2019 | Yoshida et al. | |
| 2020/0203160 A1 * | 6/2020 | Fukugawa | H01L 21/302 |
| 2020/0227268 A1 * | 7/2020 | Wang | H01L 29/30 |
| 2021/0035850 A1 * | 2/2021 | Shirley | H01L 22/20 |
| 2021/0217670 A1 * | 7/2021 | Yin | H01L 22/12 |
| 2021/0257809 A1 * | 8/2021 | Clark | H01S 5/3201 |
| 2021/0370459 A1 * | 12/2021 | Wang | H01L 29/34 |
| 2022/0037516 A1 * | 2/2022 | Chen | H01L 29/205 |

FOREIGN PATENT DOCUMENTS

| | | |
|---|---|---|
| CN | 109689946 A | 4/2019 |
| EP | 3 862 132 A1 | 8/2021 |
| EP | 3 862 133 A1 | 8/2021 |
| JP | 9-17755 A | 1/1997 |
| JP | 2003-218033 A | 7/2003 |
| JP | 2004-43257 A | 2/2004 |
| JP | 2009-182135 A | 8/2009 |
| JP | 2014-41911 A | 3/2014 |
| JP | 2016-44094 A | 4/2016 |

OTHER PUBLICATIONS

English translation of the International Preliminary Report on Patentability and Written Opinion of the International Searching Authority (Forms PCT/IB/338, PCT/IB/373 and PCT/ISA/237) for International Application No. PCT/JP2020/022198, dated Jun. 9, 2022.
Extended European Search Report for European Application No. 20880339.5, dated Jun. 15, 2022.
International Search Report for PCT/JP2020/022198 (PCT/ISA/210) dated Aug. 25, 2020.

* cited by examiner

*Primary Examiner* — Jaehwan Oh
(74) *Attorney, Agent, or Firm* — Birch, Stewart, Kolasch & Birch, LLP

(57) ABSTRACT

Provided is an indium phosphide substrate, a semiconductor epitaxial wafer, and a method for producing an indium phosphide substrate, which can satisfactorily suppress warpage of the back surface of the substrate. The indium phosphide substrate includes a main surface for forming an epitaxial crystal layer and a back surface opposite to the main surface, wherein the back surface has a BOW value of −2.0 to 2.0 μm, as measured with the back surface of the indium phosphide substrate facing upward.

13 Claims, No Drawings

INDIUM PHOSPHIDE SUBSTRATE, SEMICONDUCTOR EPITAXIAL WAFER, AND METHOD FOR PRODUCING INDIUM PHOSPHIDE SUBSTRATE

FIELD OF THE INVENTION

The present invention relates to an indium phosphide substrate, a semiconductor epitaxial wafer, and a method for producing an indium phosphide substrate.

BACKGROUND OF THE INVENTION

Indium phosphide (InP) is a Group III-V compound semiconductor material composed of indium (In) of Group III and phosphorus (P) of Group V. The semiconductor material has characteristics in which a band gap is 1.35 eV, and an electron mobility is ~5400 $cm^2/V \cdot s$, and the electron mobility under a high electric field is higher than that of other general semiconductor materials such as silicon and gallium arsenide. Further, the semiconductor material has characteristics in which its stable crystal structure under ordinary temperature and ordinary pressure is a cubic sphalerite type structure, and its lattice constant is larger than that of a compound semiconductor such as gallium arsenide (GaAs) and gallium phosphide (GaP).

An indium phosphide ingot which is a raw material for the indium phosphide substrate is generally sliced to have a predetermined thickness, ground to have a desired shape, mechanically polished as needed, and then subjected to etching or precision polishing in order to remove polishing debris and damage caused by polishing.

A main surface of the indium phosphide substrate may be provided with an epitaxial crystal layer by epitaxial growth (Patent Literature 1).

CITATION LIST

Patent Literatures

[Patent Literature 1] Japanese Patent Application Publication No. 2003-218033 A

SUMMARY OF THE INVENTION

Technical Problem

When carrying out the epitaxial growth, the indium phosphide substrate is generally supported by a susceptor from a back surface side. In this case, larger warpage of the back surface of the indium phosphide substrate results in non-uniform contact of the back surface of the substrate with the susceptor.

The non-uniform contact of the back surface of the substrate with the susceptor results in non-uniform in-plane distribution of heat conduction to the substrate, thereby leading to a non-uniform substrate temperature during epitaxial growth. Consequently, this causes problems of deteriorating the quality of the generated epitaxial crystal layer, and causing deteriorated performance of a semiconductor epitaxial wafer, such as shift of an emission wavelength.

The present invention has been made to solve the above problems. An object of the present invention is to provide an indium phosphide substrate, a semiconductor epitaxial wafer, and a method for producing an indium phosphide substrate, which can satisfactorily suppress warpage of the back surface of the substrate.

Solution to Problem

In an embodiment, the present invention relates to an indium phosphide substrate comprising a main surface for forming an epitaxial crystal layer and a back surface opposite to the main surface, wherein the back surface has a BOW value of −2.0 to 2.0 μm, as measured with the back surface of the indium phosphide substrate facing upward.

In another embodiment of the indium phosphide substrate according to the present invention, the back surface has a BOW value of −1.5 to 1.0 μm, as measured with the back surface of the indium phosphide substrate facing upward.

In another embodiment of the indium phosphide substrate according to the present invention, the back surface has a BOW value of −0.3 to 0.9 μm, as measured with the back surface of the indium phosphide substrate facing upward.

In yet another embodiment of the indium phosphide substrate according to the present invention, the back surface has a BOW value of −0.3 to 0.9 μm, as measured with the back surface of the indium phosphide substrate facing upward, and the substrate has a diameter of 100 mm or less.

In yet another embodiment of the indium phosphide substrate according to the present invention, the back surface has a BOW value of −0.3 to 0.5 μm, as measured with the back surface of the indium phosphide substrate facing upward, and the substrate has a diameter of 76.2 mm or less.

In yet another embodiment of the indium phosphide substrate according to the present invention, the back surface has a BOW value of 0.0 to 0.7 μm, as measured with the back surface of the indium phosphide substrate facing upward, and the substrate has a diameter of 50.8 mm or less.

In an embodiment of the indium phosphide substrate according to the present invention, the back surface has a SORI value of 2.5 μm or less, as measured with the back surface of the indium phosphide substrate facing upward.

In another embodiment of the indium phosphide substrate according to the present invention, the back surface has a SORI value of 1.6 to 2.5 μm, as measured with the back surface of the indium phosphide substrate facing upward.

In an embodiment of the indium phosphide substrate according to the present invention, the back surface has a WARP value of 3.5 μm or less, as measured with the back surface of the indium phosphide substrate facing upward.

In another embodiment of the indium phosphide substrate according to the present invention, the back surface has a WARP value of 1.8 to 3.5 μm, as measured with the back surface of the indium phosphide substrate facing upward.

In yet another embodiment of the indium phosphide substrate according to the present invention, the back surface has a WARP value of 1.8 to 3.4 μm, as measured with the back surface of the indium phosphide substrate facing upward.

In yet another embodiment of the present invention, the present invention relates to a semiconductor epitaxial wafer comprising an epitaxial crystal layer on the main surface of the indium phosphide substrate according to the embodiment of the present invention.

In still another embodiment, the present invention relates to a method for producing the indium phosphide substrate according to the present invention, comprising the steps of: cutting a wafer from an indium phosphide ingot with a wire saw; etching the cut wafer; chamfering an outer peripheral portion of the wafer after the etching; polishing at least one surface of the chamfered wafer; and etching the polished wafer, wherein the step of cutting the wafer from the indium phosphide ingot with the wire saw comprises a step of constantly delivering a new wire while reciprocating the wire in a horizontal direction, and moving a stage on which the indium phosphide ingot is placed in a vertical direction toward the wire, wherein a new wire delivering rate of the wire is from 10 to 60 m/min, a reciprocating rate of the wire is from 300 to 350 m/min, a vertical moving rate of the stage on which the indium phosphide ingot is placed is from 200 to 400 μm/min, and abrasive grains of the wire saw have a viscosity of from 300 to 400 mPa·s, wherein the step of etching the cut wafer comprises etching the cut wafer by a total of 5 to 15 μm from both sides, and wherein the step of etching the polished wafer comprises etching the polished wafer by a total of 8 to 15 μm from both sides.

Advantageous Effects of Invention

According to the embodiments of the present invention, it is possible to provide an indium phosphide substrate, a semiconductor epitaxial wafer, and a method for producing an indium phosphide substrate, which can satisfactorily suppress warpage of the back surface of the substrate.

DETAILED DESCRIPTION OF THE INVENTION

[Indium Phosphide Substrate]

Hereinafter, a structure of an indium phosphide substrate according to the present embodiment will be described.

The indium phosphide (InP) substrate according to the present embodiment includes a main surface for forming an epitaxial crystal layer and a back surface opposite to the main surface.

The main surface for forming the epitaxial crystal layer is a surface for actually carrying out epitaxial growth when the indium phosphide substrate is used as a substrate for epitaxial growth in order to form a semiconductor device structure.

The main surface of the indium phosphide substrate may have a maximum diameter of from 50 to 151 mm or from 50 to 101 mm, although not particularly limited thereto. A planar shape of the indium phosphide substrate may be circular or rectangular such as a quadrangle.

The indium phosphide substrate preferably has a thickness of from 300 to 900 μm, and more preferably 300 to 700 μm, for example. Particularly when the diameter is higher, there may be problems that the indium phosphide substrate may crack if the substrate has a thickness of less than 300 μm, and a base crystal may be wasted if the substrate has a thickness of more than 900 μm.

The indium phosphide substrate may contain Zn (zinc) as a dopant (impurity) such that a carrier concentration is $1 \times 10^{16}$ cm$^{-3}$ or more and $1 \times 10^{19}$ cm$^{-3}$ or less, and/or S (sulfur) such that a carrier concentration is $1 \times 10^{16}$ cm$^{-3}$ or more and $1 \times 10^{19}$ cm$^{-3}$ or less, and/or Sn (tin) such that a carrier concentration is $1 \times 10^{16}$ cm$^{-3}$ or more and $1 \times 10^{19}$ cm$^{-3}$ or less, and/or Fe (iron) such that a carrier concentration is $1 \times 10^{6}$ cm$^{-3}$ or more and $1 \times 10^{9}$ cm$^{-3}$ or less.

(BOW Value)

In the indium phosphide substrate according to the embodiment of the present invention, a BOW value of the back surface is controlled to −2.0 to 2.0 μm, as measured with the back surface facing upward. According to such a configuration, the indium phosphide substrate in which warpage of the back surface of the substrate is well suppressed can be obtained. More particularly, when the epitaxial growth is carried out, uniform contact of the back surface of the substrate with the susceptor is achieved even if the indium phosphide substrate is supported by the susceptor from the back surface side. Therefore, an in-plane distribution of heat conduction to the indium phosphide substrate becomes uniform, and a substrate temperature during epitaxial growth becomes uniform. As a result, the quality of the generated epitaxial crystal layer is improved, so that deterioration of the performance of the semiconductor epitaxial wafer such as a shift of an emission wavelength can be satisfactorily suppressed.

Here, the "BOW value" will be described. When a triangle with three vertices is drawn on a measurement surface of the indium phosphide substrate so as to surround a center point of the substrate when the indium phosphide substrate is supported and the measurement is carried out such that the original shape is not changed, a plane including the triangle is determined to be a three-point reference plane. These three points have polar coordinates such that the center of the OF is 270° with the center of the substrate as the origin, and are three points (0.97R,90°), (0.97R,210°), and (0.97R,330°) in which R is the radius of the substrate. In a direction perpendicular to the three-point reference plane, the BOW value expresses an upward direction as a positive value and a downward direction as a negative value for a distance between the center point of the substrate and the three-point reference plane. The BOW value can be measured using, for example, Ultrasort from Corning Tropel, and can be measured by storing the indium phosphide substrate in a PP cassette with the back surface facing upward and automatically conveying the substrate. In this case, the substrate should be measured in a non-adsorbed state such that the warpage of the substrate is not changed.

In the indium phosphide substrate according to the embodiment of the present invention, the BOW value of the back surface may be preferably from −1.5 to 1.0 μm, and more preferably −0.3 to 0.9 μm, as measured with the back surface of the indium phosphide substrate facing upward. Further, when the diameter of the substrate is 100 mm or less, the BOW value of the back surface may be from −0.3 to 0.9 μm, and when the diameter of the substrate is 76.2 mm or less, the BOW value of the back surface may be from −0.3 to 0.5 μm, and when the diameter of the substrate is 50.8 mm or less, the BOW value of the back surface may be from 0.0 to 0.7 μm.

(SORI Value)

In the indium phosphide substrate according to the embodiment of the present invention, a SORI value of the back surface is preferably controlled to 2.5 μm or less, as measured with the back surface facing upward and an outer peripheral portion having a width of 3 mm excluded. According to such a configuration, the indium phosphide substrate in which warpage of the back surface of the substrate is well suppressed can be obtained. More particularly, when the epitaxial growth is carried out, uniform contact of the back surface of the substrate with the susceptor is achieved even if the indium phosphide substrate is supported by the susceptor from the back surface side. Therefore, an in-plane distribution of heat conduction to the indium phosphide substrate becomes uniform, and a substrate temperature during epitaxial growth becomes uniform. As a result, the quality of the generated epitaxial crystal layer is improved, so that deterioration of the performance of the semiconductor epitaxial wafer such as a shift of an emission wavelength can be satisfactorily suppressed.

As used herein, the "SORI value" refers to the sum of maximum absolute values in positive (upward) and negative (downward) directions from a least squares plane calculated from a measured surface shape of the indium phosphide substrate, when the indium phosphide substrate is supported and measured without changing the original shape. The SORI value can be measured using, for example, Ultrasort from Corning Tropel, and can be measured by storing the indium phosphide substrate in a cassette with the back surface facing upward and automatically conveying the substrate. In this case, the substrate should be measured in a non-adsorbed state such that the warpage of the substrate is not changed.

In the indium phosphide substrate according to the embodiment of the present invention, the SORI value of the back surface may be from 1.6 to 2.5 µm, as measured with the back surface of the indium phosphide substrate facing upward. Further, when the diameter of the substrate is 100 mm or less, the SORI value may be from 1.6 to 2.5 µm, and when the diameter of the substrate is 76.2 mm or less, it may be from 1.6 to 1.8 µm, and when the diameter of the substrate is 50.8 mm or less, it may be 1.7 µm or less.

(WARP Value)

In the indium phosphide substrate according to the embodiment of the present invention, a WARP value of the back surface is preferably controlled to 3.5 µm or less, as measured with the back surface facing upward and an outer peripheral portion having a width of 3 mm excluded. According to such a configuration, the indium phosphide substrate in which warpage of the back surface of the substrate is well suppressed can be obtained. More particularly, when the epitaxial growth is carried out, uniform contact of the back surface of the substrate with the susceptor is achieved even if the indium phosphide substrate is supported by the susceptor from the back surface side. Therefore, an in-plane distribution of heat conduction to the indium phosphide substrate becomes uniform, and a substrate temperature during epitaxial growth becomes uniform. As a result, the quality of the generated epitaxial crystal layer is improved, so that deterioration of the performance of the semiconductor epitaxial wafer such as a shift of an emission wavelength can be satisfactorily suppressed.

Here, the "WARP value" will be described. When a triangle with three vertices is drawn on a measurement surface of the indium phosphide substrate so as to surround a center point of the substrate when the indium phosphide substrate is supported and the measurement is carried out such that the original shape is not changed, a plane including the triangle is determined to be a three-point reference plane. These three points have polar coordinates such that the center of the OF is 270° with the center of the substrate as the origin, and are three points (0.97R,90°), (0.97R,210°), and (0.97R, 330°) in which R is the radius of the substrate. In a direction perpendicular to the three-point reference plane, a total of a distance between the highest position of the measurement surface of the substrate as viewed from the three-point reference plane and the three-point reference plane, and a distance between the lowest position of the measurement surface of the substrate as viewed from the three-point reference plane and the three-point reference plane is the WARP value. The WARP value can be measured using, for example, Ultrasort from Corning Tropel, and can be measured by storing the indium phosphide substrate in a PP cassette with the back surface facing upward and automatically conveying the substrate. In this case, the substrate should be measured in a non-adsorbed state such that the warpage of the substrate is not changed.

In the indium phosphide substrate according to the embodiment of the present invention, the WARP value of the back surface may be from 1.8 to 3.5 µm or 1.8 to 3.4 µm as measured with the back surface of the indium phosphide substrate facing upward. Further, when the diameter of the substrate is 100 mm or less, the WARP value of the back surface may be from 1.8 to 3.4 µm, and when the diameter of the substrate is 76.2 mm or less, the WARP value of the back surface may be from 1.8 to 2.2 µm, and when the diameter of the substrate is 50.8 mm or less, the WARP value of the back surface may be 2.2 µm or less.

[Method for Producing Indium Phosphide Substrate]

Next, a method for producing an indium phosphide substrate according to an embodiment of the present invention will be described.

The method for producing the indium phosphide substrate starts from producing an indium phosphide ingot by a known method.

The indium phosphide ingot is then ground into a cylinder.

A wafer having a main surface and a back surface is then cut out from the ground indium phosphide ingot. In this case, both ends of the crystal of the indium phosphide ingot are cut along a predetermined crystal plane using a wire saw to cut out a plurality of wafers to have a predetermined thickness. In the step of cutting out the wafers, a new wire is continuously delivered while reciprocating the wire in a horizontal direction, and a stage on which the indium phosphide ingot is placed is moved in a vertical direction toward the wire.

Conditions for cutting the ingot with the wire saw are shown below:
- a new wire delivering rate of the wire: 10 to 60 m/min;
- a wire reciprocating rate: 300 to 350 m/min;
- a vertical moving rate of the stage on which the indium phosphide ingot is placed: 200 to 400 µm/min;
- management of abrasive grains of the wire saw: The abrasive grains used are GC #1200, a cutting oil is PS-LP-500D, and the abrasive grains are managed to have a viscosity of 300 to 400 mPa·s when a rotation speed of a rotor shaft of a viscometer is 60 rpm. The viscosity can be measured with a TVB-10 viscometer from TOKI SANGYO CO., LTD.

Subsequently, in order to remove affected layers generated in the cutting step with the wire saw, the cut wafer is etched by a total of 5 to 15 µm from both sides with a mixed solution of 85% by mass of an aqueous phosphoric acid solution and 30% by mass of a hydrogen peroxide solution. The wafer is etched by immersing the entire wafer in the etching solution.

Subsequently, an outer peripheral portion of the wafer is chamfered, and at least one surface, preferably both surfaces, of the chamfered wafer is polished. The polishing step is also called a wrapping step, and the wafer is polished with a predetermined abrasive to remove irregularities on the wafer surface while maintaining the flatness of the wafer.

The polished wafer is then etched by a total of 8 to 15 µm from both sides with a mixed solution of 85% by mass of an aqueous phosphoric acid solution, 30% by mass of a hydrogen peroxide solution and ultrapure water. The wafer is etched by immersing the entire wafer in the etching solution.

The main surface of the wafer is then polished with an abrasive material for mirror polishing to finish it into a mirror surface.

The resulting polished wafer is then washed to produce an indium phosphide wafer according to an embodiment of the present invention.

[Semiconductor Epitaxial Wafer]

By epitaxially growing a semiconductor thin film onto the main surface of the indium phosphide substrate according to the embodiment of the present invention by a known method, an epitaxial crystal layer can be formed to produce a semiconductor epitaxial wafer. As an example of the epitaxial growth, an InAlAs buffer layer, an InGaAs channel layer, an InAlAs spacer layer and an InP electron supply layer may be epitaxially grown onto the main surface of the indium phosphide substrate to form a HEMT structure. When producing a semiconductor epitaxial wafer having such a HEMT structure, in general, a mirror-finished indium phosphide substrate is etched with an etching solution such as sulfuric acid/hydrogen peroxide solution to remove impurities such as silicon (Si) adhering to the substrate surface. The back surface of the etched indium phosphide substrate is brought into contact with the susceptor and supported, and in this state, an epitaxial film is formed on the main surface of the indium phosphide substrate by molecular beam epitaxy (MBE) or metal organic chemical vapor deposition (MOCVD).

In this case, the indium phosphide substrate according to the embodiment of the present invention has reduced warpage of the back surface as described above, so that the contact of the back surface of the substrate with the susceptor becomes uniform. Therefore, the in-plane distribution of heat conduction to the indium phosphide substrate becomes uniform, so that the epitaxial growth can be achieved at the uniform substrate temperature.

EXAMPLES

Hereinafter, Examples are provided for better understanding of the present invention and its advantages. However, the present invention is not limited to these Examples.

Examples 1 to 6 and Comparative Examples 1 to 5 were prepared as follows:

First, ingots of indium phosphide single crystals grown with a predetermined diameter were prepared.

An outer circumference of each ingot of indium phosphide single crystals was ground into a cylinder.

A wafer having a main surface and a back surface was cut out from the ground indium phosphide ingot. In this case, both ends of the crystal of the indium phosphide ingot were cut along a predetermined crystal plane using a wire saw to cut out a plurality of wafers to have a predetermined thickness. In the step of cutting out the wafer, a new wire was continuously delivered while reciprocating the wire in the horizontal direction, and a stage on which the indium phosphide ingot was placed was moved in the vertical direction toward the wire.

Conditions for cutting the ingot with the wire saw are shown below:
- a new wire delivering rate of the wire: 10 to 60 m/min;
- a wire reciprocating rate: as shown in Table 1;
- a vertical moving rate of the stage on which the indium phosphide ingot is placed: as shown in Table 1;
- management of abrasive grains of the wire saw:

The abrasive grains used was GC #1200, a cutting oil was PS-LP-500D, and the abrasive grains were managed to have a viscosity as shown in Table 1 when a rotation speed of a rotor shaft of a viscometer was 60 rpm. The viscosity was measured with a TVB-10 viscometer from TOKI SANGYO CO., LTD.

Subsequently, in order to remove affected layers generated in the cutting step with the wire saw, the cut wafer was etched by a total of each amount shown in Table 1 from both sides with a mixed solution of 85% by mass of an aqueous phosphoric acid solution and 30% by mass of a hydrogen peroxide solution (etching after cutting). The wafer was etched by immersing the entire wafer in the etching solution.

Subsequently, an outer peripheral portion of the wafer was chamfered, and both surfaces of the chamfered wafer was polished (wrapping). In this case, the wafer was polished with a predetermined abrasive material to remove irregularities on the wafer surface while maintaining the flatness of the wafer.

The polished wafer was then etched by a total of each etching amount shown in Table 1 from both sides (thickness etched from the surface) with a mixed solution of 85% by mass of an aqueous phosphoric acid solution, 30% by mass of a hydrogen peroxide solution and ultrapure water (etching after wrapping). The wafer was etched by immersing the entire wafer in the etching solution.

The main surface of the wafer was then polished with an abrasive material for mirror polishing to finish it into a mirror surface, and then washed to produce each indium phosphide wafer having each wafer outer diameter shown in Table 1.

(Evaluation)

—Evaluation of Back Surface

Each of samples of Examples 1 to 6 and Comparative Examples 1 to 5 was stored in a PP cassette with the back surface facing upward using Ultrasort from Corning Tropel, and automatically conveyed to measure each SORI value and each WARP value that excluded the outer peripheral portion having a width of 3 mm, and further measure each BOW value. The measurement was carried out in non-adsorbed state.

—Evaluation of Surface

Each of samples of Examples 1 to 6 and Comparative Examples 1 to 5 was stored in a PP cassette with the surface facing upward using Ultrasort from Corning Tropel, and automatically conveyed to measure each WARP value and each TTV value which excluded the outer peripheral portion having a width of 3 mm. The measurement was carried out in non-adsorbed state.

In addition, the "TTV value" will be described. For TTV (Total Tickness Variation), an indium phosphide substrate is supported, a surface opposite to the measurement surface is absorbed, and the adsorbed surface is determined to be a reference surface. In a direction perpendicular to the reference surface, a difference between the highest position and the lowest position in the measurement surface of the substrate as viewed from the reference surface is the TTV value. The TTV value can be measured using, for example, Ultrasort from Corning Tropel, and can be measured by storing each indium phosphide substrate in a PP cassette with the surface facing upward and automatically conveying the substrate.

Table 1 shows the production conditions as described above and evaluation results.

TABLE 1

| | | | Example | | | | | | Comparative Example | | | | |
| --- | --- | --- | --- | --- | --- | --- | --- | --- | --- | --- | --- | --- | --- |
| | | | 1 | 2 | 3 | 4 | 5 | 6 | 1 | 2 | 3 | 4 | 5 |
| Wafer Shape (Final Shape) | Wafer Outer Diameter | (mm) | 50.0 | 76.2 | 76.2 | 76.2 | 100.0 | 100.0 | 76.2 | 76.2 | 76.2 | 76.2 | 76.2 |

TABLE 1-continued

| | | | Example | | | | | | Comparative Example | | | | |
|---|---|---|---|---|---|---|---|---|---|---|---|---|---|
| | | | 1 | 2 | 3 | 4 | 5 | 6 | 1 | 2 | 3 | 4 | 5 |
| Wafer Production Conditions | Wire Saw | Reciprocating Rate (m/min) | 320 | 320 | 350 | 320 | 320 | 320 | 500 | 320 | 320 | 320 | 320 |
| | | Stage Moving Rate (μm/min) | 400 | 330 | 300 | 300 | 230 | 230 | 320 | 500 | 320 | 320 | 320 |
| | | Abrasive Viscosity measured at 60 rpm (mPa · s) | 340 | 367 | 328 | 379 | 379 | 379 | 340 | 354 | 618 | 334 | 384 |
| | Etching After Cutting | Etching Amount (μm) | 5 | 15 | 15 | 15 | 15 | 15 | 8 | 8 | 8 | 2 | 8 |
| | Etching After Wrapping | Etching Amount (μm) | 10 | 8 | 7 | 9 | 10 | 10 | 8 | 8 | 8 | 8 | 2 |
| Evaluation Results | Back Surface Warpage | SORI (μm) | 1.7 | 1.8 | 1.7 | 1.6 | 2.4 | 2.5 | 4.2 | 5.5 | 7.3 | 10.5 | 9.3 |
| | | WARP (μm) | 2.2 | 1.8 | 2.0 | 1.8 | 2.7 | 3.4 | 5.5 | 9.0 | 8.5 | 13.7 | 10.6 |
| | | BOW (μm) | 0.7 | −0.3 | 0.5 | 0.0 | 0.9 | 0.1 | −2.3 | 2.4 | 2.5 | −4.1 | 4.4 |
| | Surface Warpage | WARP (μm) | 2.1 | 1.4 | 1.4 | 1.3 | 1.9 | 1.9 | 1.2 | 2.0 | 6.1 | 7.5 | 8.4 |
| | | TTV (μm) | 1.9 | 1.2 | 0.8 | 0.9 | 1.9 | 1.7 | 1.1 | 2.1 | 4.3 | 5.2 | 4.7 |

(Evaluation Results)

In each of Examples 1 to 6, the absolute value of the BOW value measured by placing the substrate on a flat surface with the back surface facing upward was 2.0 μm or less, an improved indium phosphide substrate providing uniform contact of the back surface of the substrate with the susceptor could be obtained.

In each of Comparative Examples 1 to 3, each parameter was not appropriate in the etching step after cutting, resulting in an indium phosphide substrate having larger warpage of the back surface.

In Comparative Example 4, the etching amount was not appropriate and processing damage during cutting could not be removed, resulting in an indium phosphide substrate having larger warpage of the back surface.

In Comparative Example 5, the etching amount was not appropriate in the etching step after wrapping, and processing damage during wrapping could not be removed, resulting in an indium phosphide substrate having larger warpage of the back surface.

The invention claimed is:

1. An indium phosphide substrate comprising a main surface for forming an epitaxial crystal layer and a back surface opposite to the main surface,
   wherein the back surface has a BOW value of −2.0 to 2.0 μm, as measured with the back surface of the indium phosphide substrate facing upward.

2. The indium phosphide substrate according to claim 1, wherein the back surface has a BOW value of −1.5 to 1.0 μm, as measured with the back surface of the indium phosphide substrate facing upward.

3. The indium phosphide substrate according to claim 2, wherein the back surface has a BOW value of −0.3 to 0.9 μm, as measured with the back surface of the indium phosphide substrate facing upward.

4. The indium phosphide substrate according to claim 3, wherein the back surface has a BOW value of −0.3 to 0.9 μm, as measured with the back surface of the indium phosphide substrate facing upward, and the substrate has a diameter of 100 mm or less.

5. The indium phosphide substrate according to claim 3, wherein the back surface has a BOW value of −0.3 to 0.5 μm, as measured with the back surface of the indium phosphide substrate facing upward, and the substrate has a diameter of 76.2 mm or less.

6. The indium phosphide substrate according to claim 3, wherein the back surface has a BOW value of 0.0 to 0.7 μm, as measured with the back surface of the indium phosphide substrate facing upward, and the substrate has a diameter of 50.8 mm or less.

7. The indium phosphide substrate according to claim 1, wherein the back surface has a SORI value of 2.5 μm or less, as measured with the back surface of the indium phosphide substrate facing upward.

8. The indium phosphide substrate according to claim 7, wherein the back surface has a SORT value of 1.6 to 2.5 μm, as measured with the back surface of the indium phosphide substrate facing upward.

9. The indium phosphide substrate according to claim 1, wherein the back surface has a WARP value of 3.5 μm or less, as measured with the back surface of the indium phosphide substrate facing upward.

10. The indium phosphide substrate according to claim 9, wherein the back surface has a WARP value of 1.8 to 3.5 μm, as measured with the back surface of the indium phosphide substrate facing upward.

11. The indium phosphide substrate according to claim 10, wherein the back surface has a WARP value of 1.8 to 3.4 μm, as measured with the back surface of the indium phosphide substrate facing upward.

12. A semiconductor epitaxial wafer comprising an epitaxial crystal layer on the main surface of the indium phosphide substrate according to claim 1.

13. A method for producing the indium phosphide substrate according to claim 1, comprising the steps of:
   cutting a wafer from an indium phosphide ingot with a wire saw;
   etching the cut wafer;
   chamfering an outer peripheral portion of the wafer after the etching;
   polishing at least one surface of the chamfered wafer; and
   etching the polished wafer,
   wherein the step of cutting the wafer from the indium phosphide ingot with the wire saw comprises a step of constantly delivering a new wire while reciprocating the wire in a horizontal direction, and moving a stage on which the indium phosphide ingot is placed in a vertical direction toward the wire, wherein a new wire delivering rate of the wire is from 10 to 60 m/min, a reciprocating rate of the wire is from 300 to 350 m/min, a vertical moving rate of the stage on which the indium phosphide ingot is placed is from 200 to 400 μm/min, and abrasive grains of the wire saw have a viscosity of from 300 to 400 mPa·s, wherein the step of etching the cut wafer comprises etching the cut wafer by a total of 5 to 15 μm from both sides, and wherein the step of etching the polished wafer comprises etching the polished wafer by a total of 8 to 15 μm from both sides.

\* \* \* \* \*